(12) United States Patent
Hsu et al.

(10) Patent No.: US 11,183,660 B2
(45) Date of Patent: Nov. 23, 2021

(54) DISPLAY DEVICE

(71) Applicant: Au Optronics Corporation, Hsinchu (TW)

(72) Inventors: Wei-Chu Hsu, Taipei (TW); Ko-Ruey Jen, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 133 days.

(21) Appl. No.: 16/684,473

(22) Filed: Nov. 14, 2019

(65) Prior Publication Data
US 2020/0212350 A1 Jul. 2, 2020

(30) Foreign Application Priority Data
Dec. 26, 2018 (TW) ................... 107147076

(51) Int. Cl.
*H01L 27/32* (2006.01)
*H01L 51/52* (2006.01)

(52) U.S. Cl.
CPC ...... *H01L 51/5228* (2013.01); *H01L 27/3246* (2013.01)

(58) Field of Classification Search
CPC .................. H01L 51/5228; H01L 27/3246
See application file for complete search history.

(56) References Cited

U.S. PATENT DOCUMENTS

| | | | |
|---|---|---|---|
| 7,053,426 B2 | 5/2006 | Yokoyama et al. | |
| 9,859,520 B2 | 1/2018 | Kim | |
| 10,074,711 B2 | 9/2018 | Han | |
| 10,418,582 B2 | 9/2019 | Im et al. | |
| 2005/0110132 A1 | 5/2005 | Yokoyama et al. | |
| 2016/0064464 A1* | 3/2016 | Namkung | H01L 27/1218 257/40 |
| 2017/0047379 A1* | 2/2017 | Yim | H01L 51/5275 |
| 2018/0151828 A1 | 5/2018 | Im et al. | |
| 2018/0219056 A1 | 8/2018 | Han | |
| 2020/0127225 A1* | 4/2020 | Zhang | H01L 27/3258 |
| 2020/0266215 A1 | 8/2020 | Dong et al. | |

FOREIGN PATENT DOCUMENTS

| | | | |
|---|---|---|---|
| CN | 104681595 | 6/2015 | |
| CN | 106206673 | 12/2016 | |
| CN | 106653819 | 5/2017 | |
| CN | 107611283 A * | 1/2018 | ......... H01L 51/5228 |
| TW | I240420 | 9/2005 | |
| TW | 201826522 | 7/2018 | |

* cited by examiner

*Primary Examiner* — Fernando L Toledo
*Assistant Examiner* — Valerie N Newton
(74) *Attorney, Agent, or Firm* — JCIPRNET

(57) ABSTRACT

A display device includes a substrate, an auxiliary electrode, a buffer layer, a plurality of active elements, and a plurality of light-emitting elements. The auxiliary electrode is disposed on the substrate and overlapped with an active region. The buffer layer is disposed on the auxiliary electrode. The plurality of active elements are disposed on the buffer layer and disposed in the active region. The plurality of light-emitting elements are electrically connected with the active elements, respectively. Each of the light-emitting elements includes a first electrode, a second electrode, and a light-emitting layer disposed between the first electrode and the second electrode. Each of the second electrodes is electrically connected with the auxiliary electrode.

20 Claims, 5 Drawing Sheets

DISPLAY DEVICE

CROSS-REFERENCE TO RELATED APPLICATION

This application claims the priority benefit of Taiwan application serial no. 107147076, filed on Dec. 26, 2018. The entirety of the above-mentioned patent application is hereby incorporated by reference herein and made a part of this specification.

BACKGROUND

Technical Field

The present invention relates to a display device, and more particularly to a display device having an auxiliary electrode.

Description of Related Art

In the conventional display device, a driving chip is usually disposed around the active region, and a plurality of light-emitting elements on the active region are controlled by the driving chip. However, not every light-emitting element and the driving chip have the same distance. Therefore, a light-emitting element that is farther away from the driving chip may have IR drop due to a longer path of the voltage signal transmission. The problem of IR Drop causes the signals transmitted to the light-emitting elements at different locations to be uneven, which causes the display device to generate bright mura or color mura.

SUMMARY

An embodiment of the present invention provides a display device that can improve an issue of IR Drop.

A display device according to an embodiment of the present invention includes a substrate, an auxiliary electrode, a buffer layer, a plurality of active elements, and a plurality of light-emitting elements. The auxiliary electrode is disposed on the substrate and overlaps the active region. The buffer layer is disposed on the auxiliary electrode. The plurality of active elements are located on the buffer layer and are located in the active region. The plurality of light-emitting elements are electrically connected to the plurality of active elements, respectively. Each of the light-emitting elements includes a first electrode, a second electrode, and a light-emitting layer between the first electrode and the second electrode. Each of the second electrodes is electrically connected to the auxiliary electrode.

In the display device according to the embodiment of the present invention, the second electrode is electrically connected to the auxiliary electrode, and thus the auxiliary electrode improves the problem of IR Drop of the light-emitting element due to the excessive resistance of the second electrode.

In order to make the aforementioned features and advantages of the disclosure more comprehensible, embodiments accompanying figures are described in detail below.

DESCRIPTION OF THE EMBODIMENTS

Figure 1A:
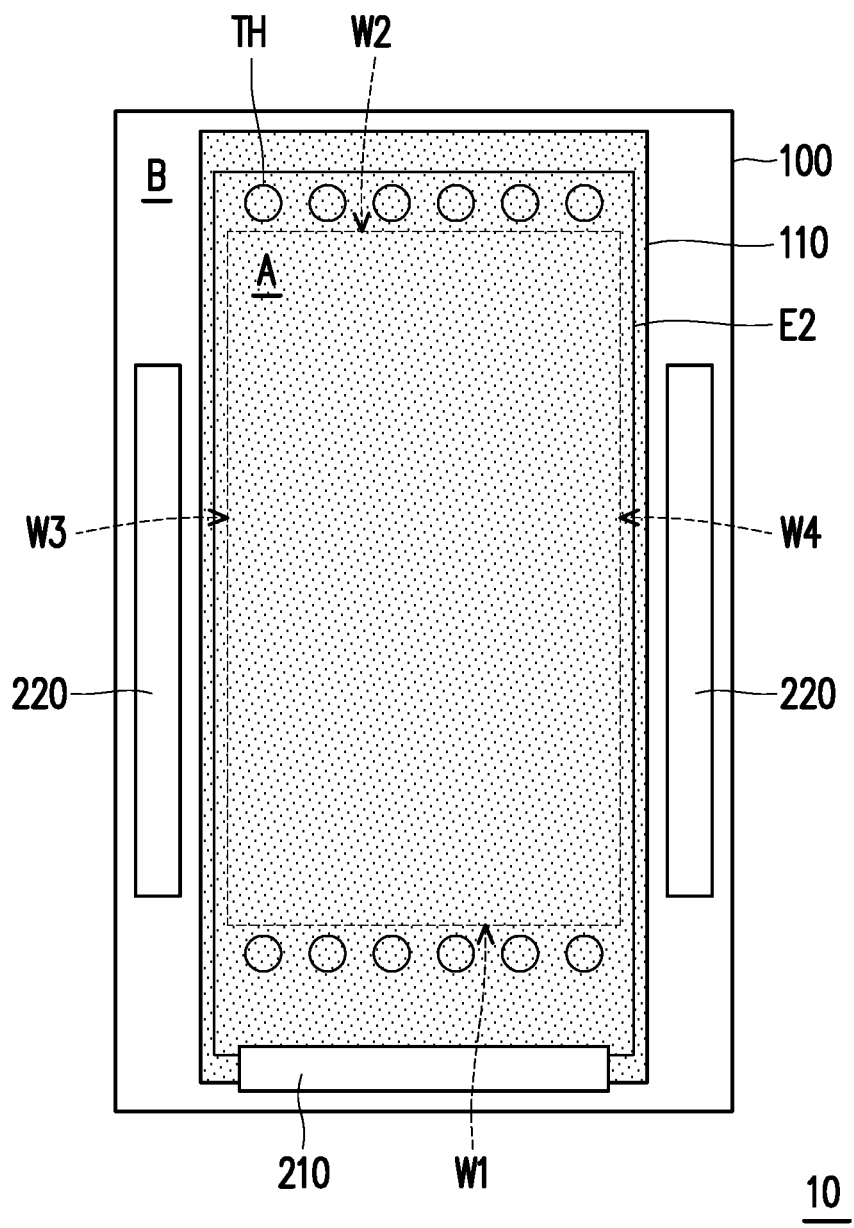
FIG. 1A is a schematic top view of a display device in accordance with an embodiment of the present invention.
Figure 1B:
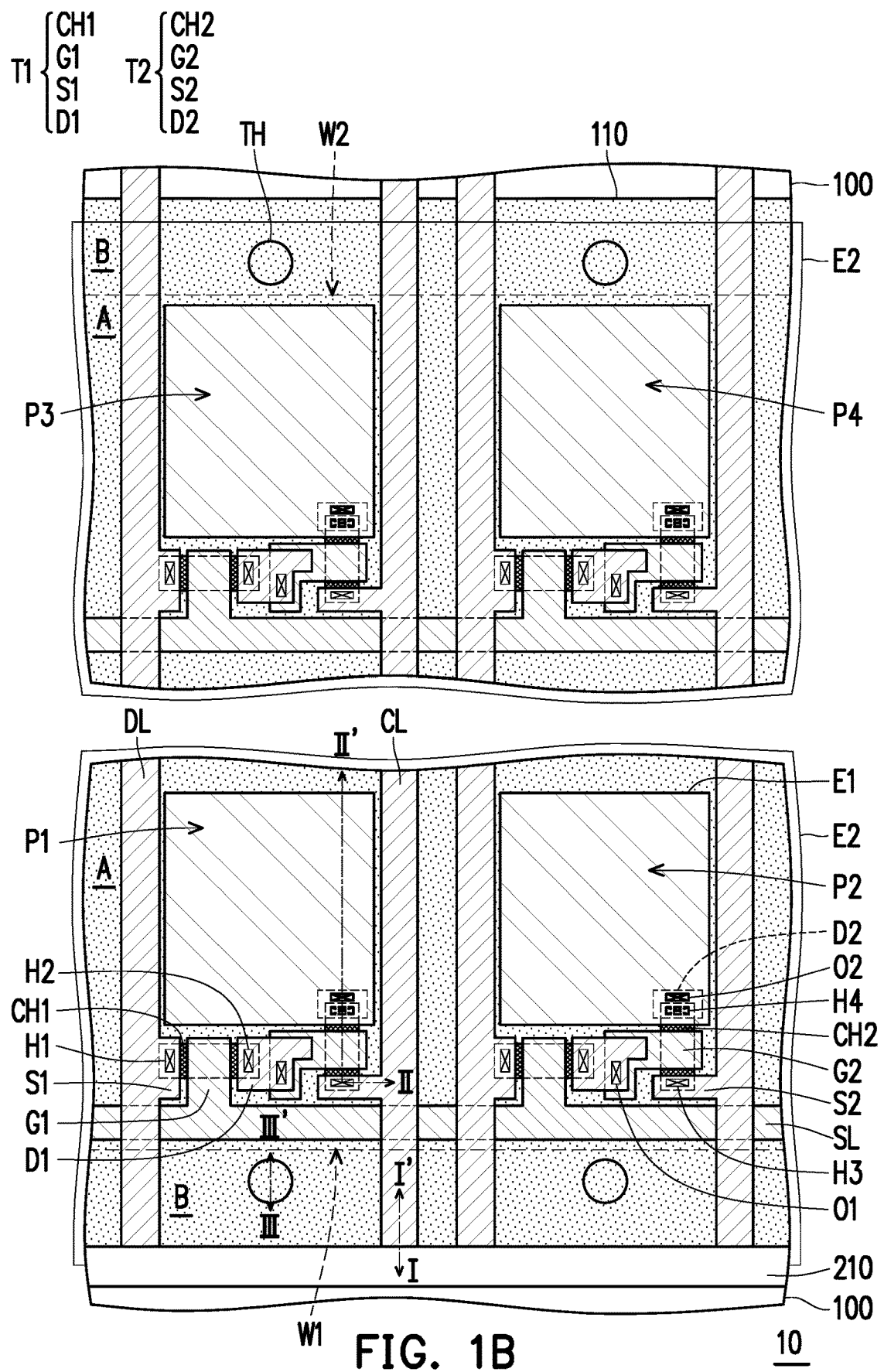
FIG. 1B is a partial schematic top view of a display device in accordance with an embodiment of the present invention.
Figure 1C:
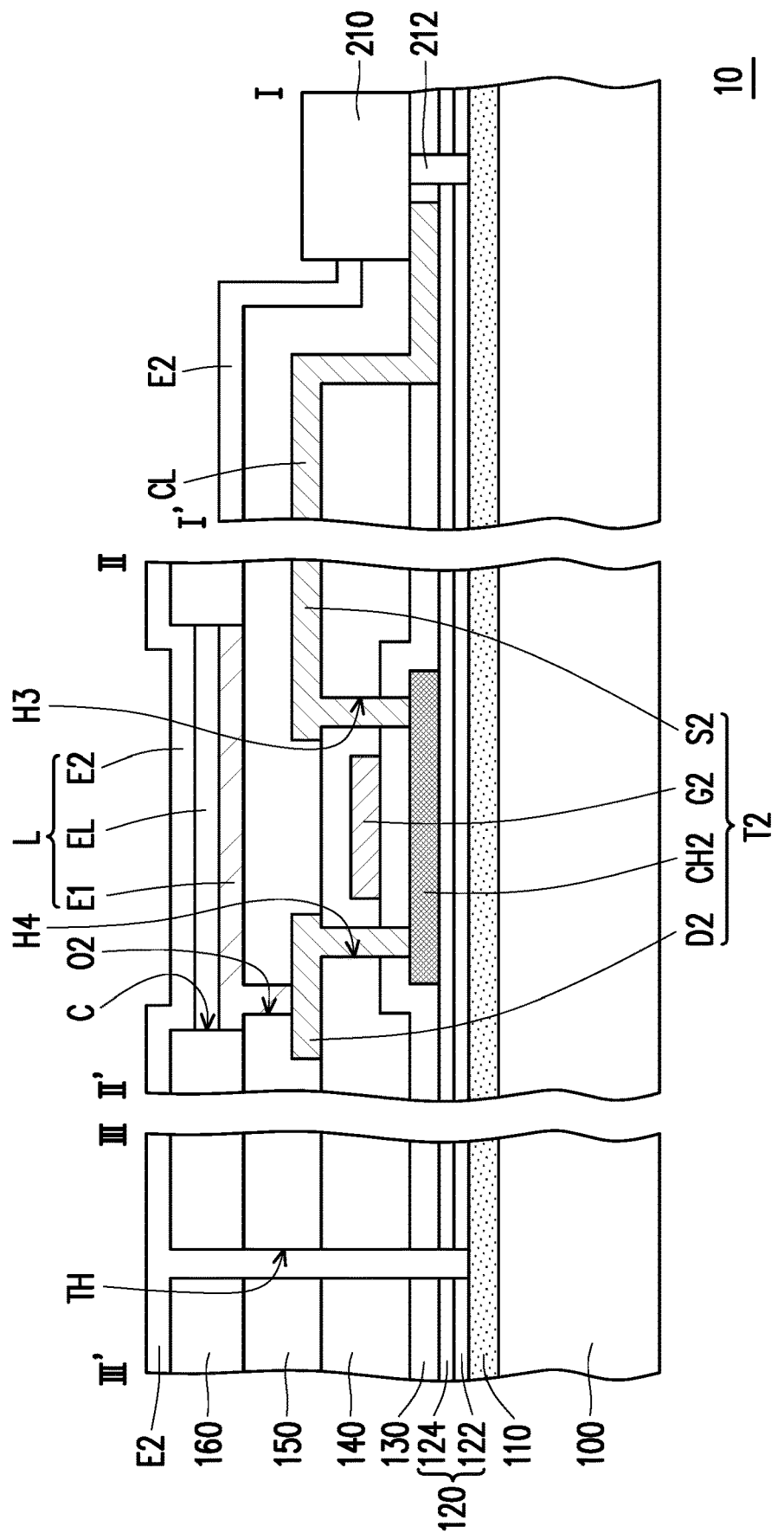
FIG. 1C is a schematic cross-sectional view taken along line I-I', II-II', and III-III' of FIG. 1B.

FIG. 1A is a schematic top view of a display device in accordance with an embodiment of the present invention. FIG. 1B is a partial schematic top view of a display device in accordance with an embodiment of the present invention. FIG. 1C is a schematic cross-sectional view taken along line I-I', II-II', and III-III' of FIG. 1B.

Referring to FIG. 1A to FIG. 1C, a display device 10 includes a substrate 100, an auxiliary electrode 110, a buffer layer 120, a plurality of active elements T1, T2, and a plurality of light-emitting elements L. In addition, the display device 10 may further include a gate insulating layer 130, a first insulating layer 140, a second insulating layer 150, a pixel defining layer 160, a chip 210, a pad 212, and a gate driving circuit 220. For convenience of explanation, some components are omitted in FIG. 1A and FIG. 1B.

In the present embodiment, the display device 10 has an active region A and a peripheral region B located outside the active region A. The auxiliary electrode 110 is disposed on the substrate 100 and overlaps the active region A. For example, the auxiliary electrode 110 is entirely overlapped with the active region A, and a portion of the auxiliary electrode 110 extends from the active region A to the peripheral region B. In other embodiments, the auxiliary electrode 110 entirely covers the substrate 100. The material of the auxiliary electrode 110 includes, for example, titanium, aluminum, molybdenum, copper, gold, other metal materials or a combination of the above materials. The thickness of the auxiliary electrode 110 ranges from about 100 nm to about 500 nm.

The buffer layer 120 is disposed on the auxiliary electrode 110, and the auxiliary electrode 110 is located between the buffer layer 120 and the substrate 100. In the present embodiment, the buffer layer 120 has a multilayer structure. For example, the buffer layer 120 includes a first sub-layer 122 and a second sub-layer 124. The first sub-layer 122 is disposed on the auxiliary electrode 110, and the second sub-layer 124 is disposed on the first sub-layer 122. The material of the first sub-layer 122 includes silicon oxide or silicon nitride, and the thickness of the first sub-layer 122 ranges from about 50 nm to about 500 nm. The material of the second sub-layer 124 includes silicon oxide or silicon nitride, and the thickness of the second sub-layer 124 ranges from about 50 nm to about 500 nm. In other embodiments, the buffer layer 120 may be a single layer structure or a stacked structure of three or more layers.

The plurality of active elements T1, T2 are located on the buffer layer 120. The active elements T1, T2 may be any of the top gate type thin film transistors, bottom gate type thin film transistors or other suitable types of thin film transistors known to those skilled in the art. In the present embodiment, the active element T1 is a top gate type thin film transistor including a channel layer CH1, a gate G1, a source S1 and a drain D1. The gate G1 overlaps the channel layer CH1, and the gate insulating layer 130 is interposed between the gate G1 and the channel layer CH1. The gate insulating layer 130 is located on the buffer layer 120 and the channel layer CH1. The first insulating layer 140 is located on the gate G1 and the gate insulating layer 130. The source S1 and the drain D1 are located on the first insulating layer 140, and the source S1 and the drain D1 are electrically connected to the channel layer CH1 by an opening H1 and an opening H2, respectively. The openings H1, H2 at least penetrate through the first insulating layer 140. In the present embodiment, the openings H1, H2 penetrate through the gate insulating layer 130 and the first insulating layer 140.

In the embodiment, the active element T2 is electrically connected to the active element T1. The active element T2 includes a channel layer CH2, a gate G2, a source S2, and a drain D2. The gate G2 of the active element T2 is electrically connected to the active element T1. The gate G2 overlaps the channel layer CH2, and the gate insulating layer 130 is interposed between the gate G2 and the channel layer CH2. The source S2 and the drain D2 are located on the first insulating layer 140, and the source S2 and the drain D2 are electrically connected to the channel layer CH2 by an opening H3 and an opening H4, respectively. The openings H3 and H4 at least penetrate through the first insulating layer 140. In the present embodiment, the openings H3 and H4 penetrate through the gate insulating layer 130 and the first insulating layer 140.

In the present embodiment, the gate G2 of the active element T2 is electrically connected to the drain D1 of the active element T1. For example, the drain D1 is electrically connected to the gate G2 by an opening O1 of the first insulating layer 140. The gate G1 of the active element T1 is electrically connected to a scan line SL, and the source S1 is electrically connected to a data line DL. In the present embodiment, the extending direction of the scan line SL is different from the extending direction of the data line DL, and it is preferable that the extending direction of the scan line SL is perpendicular to the extending direction of the data line DL. In addition, the scan line SL and the data line DL may be located in different layers, and an insulating layer (e.g., the first insulating layer 110) may be interposed between the scan line SL and the data line DL. Based on the conductivity considerations, the scan line SL and the data line DL are generally made of a metal material. However, the present invention is not limited thereto. According to other embodiments, the scan line SL and the data line DL may also use other conductive material such as an alloy, a nitride of a metal material, an oxide of a metal material, or an oxynitride of a metal material, or a stacked layer of a metal material and the aforementioned other conductive material. In addition, the material of the insulating layer may be an inorganic material, an organic material or a combination thereof, wherein the inorganic material is, for example, silicon oxide, silicon nitride, silicon oxynitride, or a stacked layer of at least two materials; the organic material is, for example, a polymer material such as a polyimide resin, an epoxy resin, or an acrylic resin.

In the present embodiment, the source S2 of the active element T2 is electrically connected to a common line CL. In the present embodiment, the common line CL and the data line DL are substantially parallel, and both belong to the same layer. In other words, the common line CL and the data line DL may be patterned by the same layer, but the invention is not limited thereto. In other embodiments, the common line CL and the data line DL belong to different layers.

The second insulating layer 150 is disposed on the first insulating layer 140 and covers the active elements T1, T2.

The plurality of light-emitting elements L are electrically connected to the plurality of active elements T2, respectively. Each of the light-emitting elements L includes a first electrode E1, a second electrode E2, and a light-emitting layer EL between the first electrode E1 and the second electrode E2. The first electrode E1 is disposed on the second insulating layer 150. The first electrode E1 is electrically connected to the drain D2 of the active element T2 by an opening O2 in the second insulating layer 150. The pixel defining layer 160 is disposed on the second insulating layer 150 and has an opening C corresponding to the first electrode E1. The light-emitting layer EL is disposed on the first electrode E1 and filled in the opening C. In the present embodiment, the material of the light-emitting layer EL includes an organic light-emitting material, in other words, the light-emitting element L is an organic light-emitting diode (OLED). The second electrode E2 is disposed on the light-emitting layer EL. The material of the second electrode E2 is a transparent or translucent conductive material, such as silver, aluminum, lithium, magnesium, calcium, indium, gold, indium tin oxide or other suitable materials. The thickness of the second electrode E2 ranges from about 1 nm to about 50 nm. In the present embodiment, the display device 10 uses a top emission light-emitting element L. That is, the second electrode E2 is located on the light-emitting surface of the light-emitting element L. It is noted that FIG. 1A and FIG. 1B illustrate that the second electrodes E2 of the light-emitting elements L are connected with each other.

Each of the second electrodes E2 is electrically connected to the auxiliary electrode 110. In the present embodiment, the second electrodes E2 of the light-emitting elements L are electrically connected to the auxiliary electrode 110 by through holes TH. The through hole TH penetrates, for example, through the buffer layer 120, the gate insulating layer 130, the first insulating layer 140, the second insulating layer 140, and the pixel defining layer 160, but the present invention is not limited thereto.

In the present embodiment, the through holes TH, the chip 210, and the gate driving circuit 220 are located in the peripheral region B. The through holes TH are located at the first side W1 and the second side W2 of the active region A, wherein the first side W1 is opposite to the second side W2. The gate driving circuit 220 is located on the third side W3 and the fourth side W4 of the active region A, wherein the third side W3 is opposite to the fourth side W4. The chip 210 is located on the first side W1 of the active region A. The through holes TH are exemplified as being arranged along the first side W1 and/or along the second side W2. The plurality of sub-pixels P1 to P4 are exemplified as between the through holes TH arranged along the first side W1 and the through holes TH arranged along the second side W2. The through holes TH do not overlap the data line DL and the common line CL in the vertical projection direction of the substrate 100.

The gate driving circuit 220 is electrically connected to the scan line SL. The gate driving circuit 220 is formed, for example, by a gate driver on array (GOA) technique, but the present invention is not limited thereto.

The chip 210 is electrically connected to the data line DL, the common line CL, the second electrode E2, and the auxiliary electrode 110. In the present embodiment, the chip 210 is electrically connected to the auxiliary electrode 110 by the pad 212, but the invention is not limited thereto. In other embodiments, the chip 210 is electrically connected to the common line CL, the data line DL, and the second electrode E2 by other pads. The common line CL, the data line DL, and the second electrode E2 are electrically connected to the different pins of the chip 210, respectively. In the present embodiment, the second electrode E2 is directly connected to the chip 210, but the present invention is not limited thereto. In other embodiments, the second electrode E2 is electrically connected to the chip 210 by the auxiliary electrode 110.

In FIG. 1B, the display device 10 is exemplified as including four sub-pixels P1 to P4, but the present invention is not limited thereto. Each of the sub-pixels P1 to P4 may include the light-emitting element L, the active element T1, and the active element T2. The sub-pixels P3 and P4 are farther away from the chip 210 than the sub-pixels P1 and P2. In other words, compared to the sub-pixels P1 and P2, the signal transmitted from the chip 210 to the sub-pixels P3 and P4 requires a long transmission distance. In the present embodiment, the voltage signal on the second electrode E2 can be assisted by the auxiliary electrode 110, whereby the problem of IR Drop of the light-emitting element L due to the excessive resistance of the second electrode E2 can be improved. In the present embodiment, the auxiliary electrode 110 can also be used as a heat dissipation layer, which can have the effect of cooling the channel layers CH1 and CH2 of the active elements T1 and T2, and the auxiliary electrode 110 completely overlap the channel layers CH1 and CH2 in the vertical projection direction of the substrate 100, but the present invention is not limited thereto.

In the present embodiment, the sub-pixels P1 to P4 each are exemplified as including the light-emitting element L, the active element T1, and the active element T2, but the present invention is not limited thereto. In other embodiments, each of the sub-pixels P1 to P4 may further include a capacitor to constitute a control circuit with 2T1C architecture. In other embodiments, each of the sub-pixels P1 to P4 may include other type of control circuit, and the number of active elements and passive elements in each of the sub-pixels P1 to P4 is not particularly limited.

Figure 2:
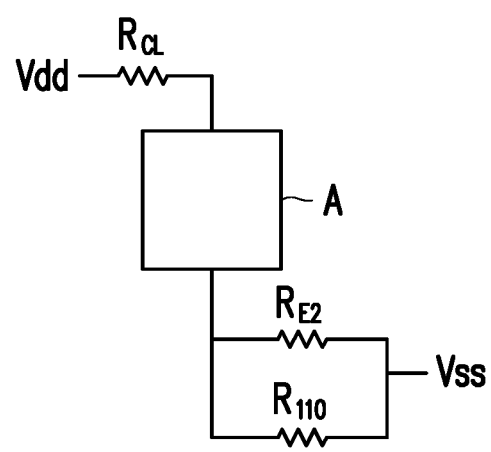
FIG. 2 is a partial circuit diagram of a display device in accordance with an embodiment of the present invention.

FIG. 2 is a partial circuit diagram of a display device in accordance with an embodiment of the present invention. For example, FIG. 2 is a partial circuit diagram of the display panel 10 of FIG. 1A to FIG. 1C.

Referring to FIG. 2 and FIG. 1B, the active region A is electrically connected to the voltage signal Vdd and the voltage signal Vss. For example, the common line CL is electrically connected to the voltage signal Vdd, and the second electrode E2 of the light-emitting element L and the auxiliary electrode 110 are electrically connected to the voltage signal Vss.

In the present embodiment, the voltage signal Vdd is electrically connected to the common line CL, and the common line CL has a resistance $R_{CL}$. The voltage signal Vss is electrically connected to the auxiliary electrode 110 in addition to being electrically connected to the second electrode E2. In the present embodiment, a resistance $R_{E2}$ refers to the total resistance of the plurality of second electrodes E2. The auxiliary electrode 110 has a resistance $R_{110}$. Since the resistance obtained by connecting the resistance $R_{E2}$ and the resistance $R_{110}$ in parallel is smaller than the resistance $R_{110}$ alone or the resistance $R_{E2}$ alone, the voltage signal Vss is less likely to be lost due to the problem of IR Drop, thereby the issue of bright mura or color mura may not arise in the display device.

In some embodiments, the resistance $R_{110}$ is smaller than the resistance $R_{E2}$, whereby the problem of IR Drop of the display device can be further improved.

Figure 3:
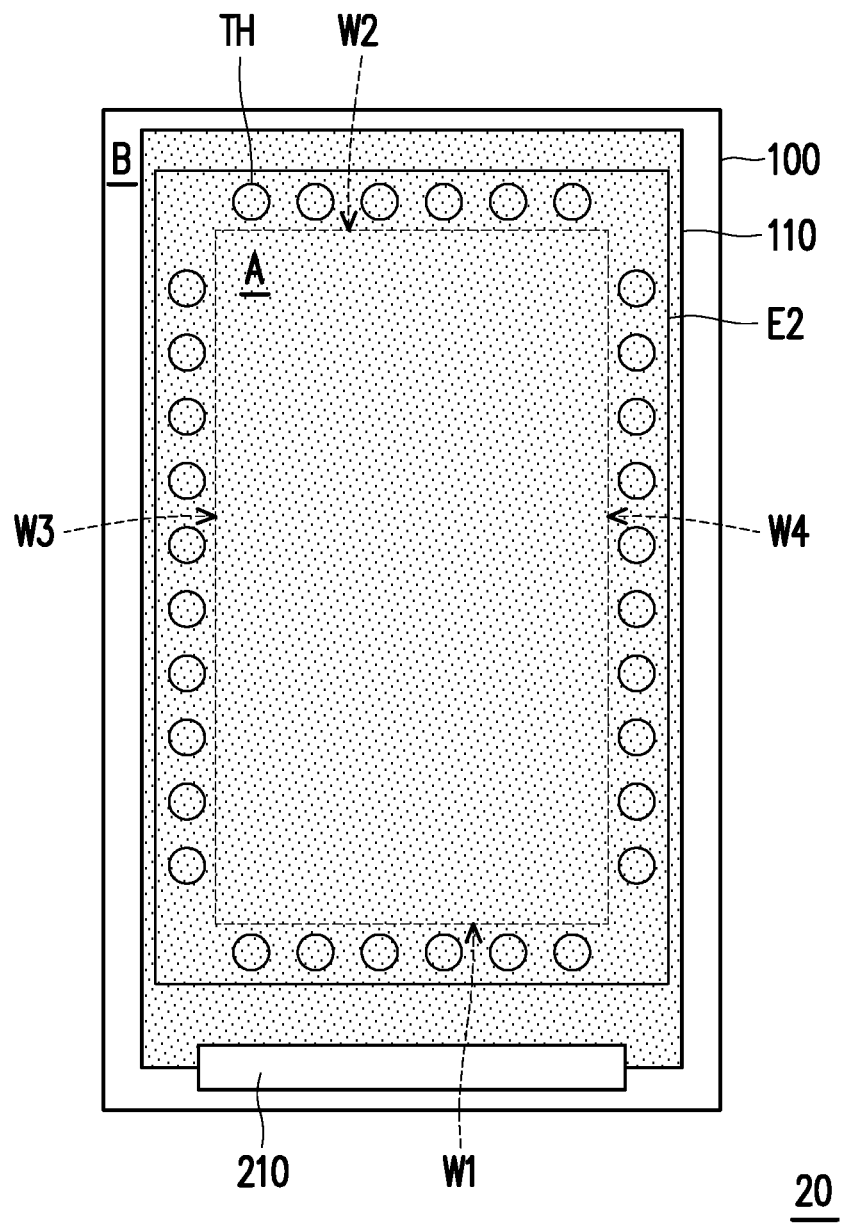
FIG. 3 is a schematic top view of a display device in accordance with another embodiment of the present invention.

FIG. 3 is a schematic top view of a display device in accordance with another embodiment of the present invention. Hereinafter, a detailed description will be given with reference to FIG. 3. It should be noted that the reference numerals and some descriptions in the previous embodiment are used in the following embodiments, in which identical or similar reference numerals indicate identical or similar elements, and repeated description of the same technical contents is omitted. The omitted part of the description can refer to the foregoing embodiments, which is not repeated in the following embodiments.

Referring to FIG. 3, the display device 20 of FIG. 3 is similar to the display device 10 of FIG. 1A, and therefore, identical or similar elements are referred to with identical or similar reference numerals, and the descriptions of the same technical contents are omitted. The omitted part of the description can refer to the foregoing embodiments, which is not repeated in the following embodiments. In the following, the difference between the display device 20 of FIG. 3 and the display device 10 of FIG. 1A is described.

Referring to FIG. 3, in the present embodiment, the through holes TH are located on the first side W1 and the second side W2 of the active region A, and also on the third side W3 and the fourth side W4 of the active region A. The through holes TH are arranged along the first side W1, the third side W3, the second side W2, and the fourth side W4. By providing more through holes TH, the voltage on the auxiliary electrode 110 and the second electrode E2 can be distributed more uniformly.

Although the gate driving circuit is not provided in the third side W3 and the fourth side W4 of the active region A in the present embodiment, the present invention is not limited thereto. In other embodiments, the peripheral region B has sufficient space, and the third side W3 and the fourth side W4 of the active region A are provided with the gate driving circuit and the through holes TH. The gate driving circuit may be located between the through holes TH and the active region A.

In the present embodiment, the second electrode E2 is not directly connected to the chip 210. The second electrode E2 is electrically connected to the auxiliary electrode 110 by the through holes TH, and is electrically connected to the chip 210 by the auxiliary electrode 110.

In summary, in the display device of the present invention, the auxiliary electrode is included to assist in transmitting the voltage signal on the second electrode, thereby the problem of IR Drop of the light-emitting element due to the excessive resistance of the second electrode is eased, and then the issue of bright mura or color mura may not arise in the display device. In some embodiments, the auxiliary electrode can also be used as a heat dissipation layer, which can have the effect of cooling the channel layer of the active element.

The present invention has been disclosed in the above embodiments, but it is not intended to limit the invention, and any one of ordinary skill in the art can make some changes and refinements without departing from the spirit and scope of the invention. The scope of the invention is defined by the scope of the appended claims.

What is claimed is:

1. A display device, comprising:
   a substrate;
   an auxiliary electrode disposed on the substrate and overlapped with an active region;
   a buffer layer disposed on the auxiliary electrode;
   a plurality of active elements disposed on the buffer layer and located in the active region; and
   a plurality of light-emitting elements respectively electrically connected to the active elements, wherein each of the light-emitting elements includes a first electrode, a second electrode, and a light-emitting layer between the first electrode and the second electrode, wherein each of the second electrodes is electrically connected to the auxiliary electrode, the second electrodes are electrically connected to the auxiliary electrode by a plurality of through holes penetrating through the buffer layer, the through holes are distributed and located on a first side and a second side of the active region, and the first side is opposite to the second side.

2. The display device of claim 1, further comprising a chip, wherein the auxiliary electrode and the second electrodes are electrically connected to the chip.

3. The display device of claim 1, further comprising a gate driving circuit disposed on a third side and a fourth side of the active region, and the third side is opposite to the fourth side.

4. The display device of claim 1, wherein the through holes are distributed and located on the first side, the second side, a third side and a fourth side of the active region, and the third side is opposite to the fourth side.

5. The display device of claim 1, further comprising:
a gate insulating layer disposed on the buffer layer;
a first insulating layer disposed on the gate insulating layer;
a second insulating layer disposed on the first insulating layer and covering the active elements; and
a pixel defining layer disposed on the second insulating layer.

6. The display device of claim 1, wherein a material of the auxiliary electrode comprises titanium, aluminum, molybdenum, copper, gold or a combination thereof.

7. The display device of claim 1, wherein a thickness of the auxiliary electrode ranges from about 100 nm to about 500 nm.

8. The display device of claim 1, wherein a material of the second electrodes comprises silver, aluminum, lithium, magnesium, calcium, indium, gold, indium tin oxide or a combination thereof.

9. The display device of claim 1, wherein a thickness of the second electrodes ranges from about 1 nm to about 50 nm.

10. The display device of claim 1, wherein the buffer layer comprises:
a first sub-layer disposed on the auxiliary electrode, wherein a material of the first sub-layer comprises silicon oxide or silicon nitride, and a thickness of the first sub-layer ranges from about 50 nm to about 500 nm; and
a second sub-layer disposed on the first sub-layer, wherein a material of the second sub-layer comprises silicon oxide or silicon nitride, and a thickness of the second sub-layer ranges from about 50 nm to about 500 nm.

11. A display device, comprising:
a substrate;
an auxiliary electrode disposed on the substrate and entirely overlapped with an active region;
a buffer layer disposed on the auxiliary electrode;
a plurality of active elements disposed on the buffer layer and located in the active region; and
a plurality of light-emitting elements respectively electrically connected to the active elements, wherein each of the light-emitting elements includes a first electrode, a second electrode, and a light-emitting layer between the first electrode and the second electrode, wherein each of the second electrodes is electrically connected to the auxiliary electrode.

12. The display device of claim 11, further comprising a chip, wherein the auxiliary electrode and the second electrodes are electrically connected to the chip.

13. The display device of claim 11, wherein the second electrodes are electrically connected to the auxiliary electrode by a plurality of through holes penetrating through the buffer layer.

14. The display device of claim 13, wherein the through holes are distributed and located on a first side and a second side of the active region, and the first side is opposite to the second side.

15. The display device of claim 14, further comprising a gate driving circuit disposed on a third side and a fourth side of the active region, and the third side is opposite to the fourth side.

16. The display device of claim 14, wherein the through holes are distributed and located on the first side, the second side, a third side and a fourth side of the active region, and the third side is opposite to the fourth side.

17. The display device of claim 11, wherein a material of the auxiliary electrode comprises titanium, aluminum, molybdenum, copper, gold or a combination thereof.

18. The display device of claim 11, wherein a thickness of the auxiliary electrode ranges from about 100 nm to about 500 nm.

19. The display device of claim 11, wherein a material of the second electrodes comprises silver, aluminum, lithium, magnesium, calcium, indium, gold, indium n oxide or a combination thereof.

20. The display device of claim 11, wherein a thickness of the second electrodes ranges from about 1 nm to about 50 nm.

* * * * *